United States Patent [19]
Rennie et al.

[11] Patent Number: 5,786,603
[45] Date of Patent: Jul. 28, 1998

[54] MULTILAYER STRUCTURED SEMICONDUCTOR DEVICES

[75] Inventors: John Rennie, Tokyo; Genichi Hatakoshi; Shinji Saito, both of Yokohama, all of Japan

[73] Assignee: Kabushiki Kaisha Toshiba, Kawasaki, Japan

[21] Appl. No.: 711,884

[22] Filed: Sep. 12, 1996

[30] Foreign Application Priority Data

Sep. 12, 1995 [JP] Japan .................... 7-234428
Jun. 18, 1996 [JP] Japan .................... 8-156967

[51] Int. Cl.$^6$ .................... H01L 129/06; H01L 31/0328; H01L 31/0336; H01L 31/072
[52] U.S. Cl. .................... 257/13; 257/15; 257/101; 257/103
[58] Field of Search .................... 257/13–15, 101, 257/103

[56] References Cited

U.S. PATENT DOCUMENTS

| | | | |
|---|---|---|---|
| 5,428,227 | 6/1995 | Satoh | 257/95 |
| 5,442,204 | 8/1995 | Mensz | 257/103 |
| 5,521,396 | 5/1996 | Shakuda | 257/15 |
| 5,548,137 | 8/1996 | Fan et al. | 257/191 |
| 5,585,306 | 12/1996 | Miyazawa | 437/129 |
| 5,585,648 | 12/1996 | Tischler | 257/77 |

FOREIGN PATENT DOCUMENTS

| | | |
|---|---|---|
| 61-46031 | 3/1986 | Japan . |
| 2-251909 | 10/1990 | Japan . |
| 6-350204 | 12/1994 | Japan . |
| 7-235727 | 9/1995 | Japan . |

*Primary Examiner*—Wael Fahmy
*Assistant Examiner*—Howard Weiss
*Attorney, Agent, or Firm*—Oblon, Spivak, McClelland, Maier & Neustadt, P.C.

[57] ABSTRACT

At an n—n hetero-interface in a ZnSe-based or GaN-based multilayered semiconductor laser and light-emitting diode, an excessive voltage drop causing the operating voltage to increased is reduced, thereby lengthening the service life of the device. A single or plurality of n-type intermediate layers are provided in the n—n hetero-interface region where the excessive voltage drop develops. The excessive voltage drop developing at the n—n hetero-interface is decreased by setting the energy value at the edge of the conduction band of each intermediate layer to a mid-value between the energy values at the edges of the conduction bands of the n-type compound semiconductors adjoining both sides of the intermediate layer. The configuration of a GaN-based MQW laser including the intermediate layer formed on sapphire substrate is shown. The relationship between the lattice constant of an intermediate layer necessary for obtaining an intermediate layer excellent in crystallinity suitable for the above object and the lattice constants of compound semiconductors adjoining both sides of the intermediate layer is described.

6 Claims, 13 Drawing Sheets

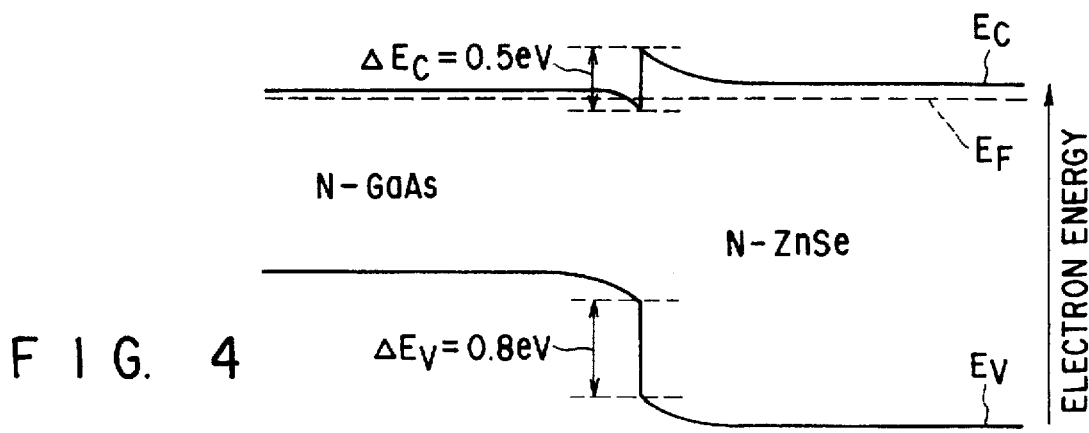
F I G. 4
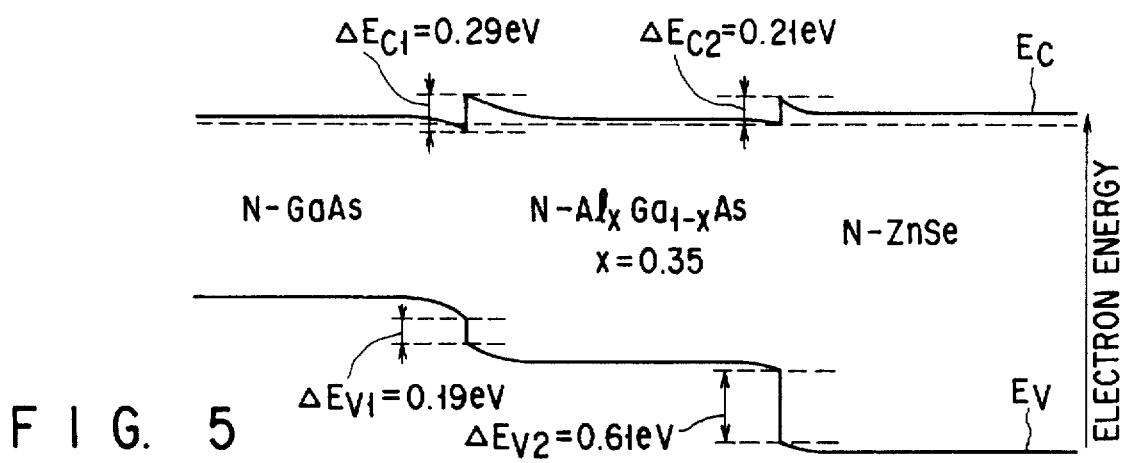
F I G. 5
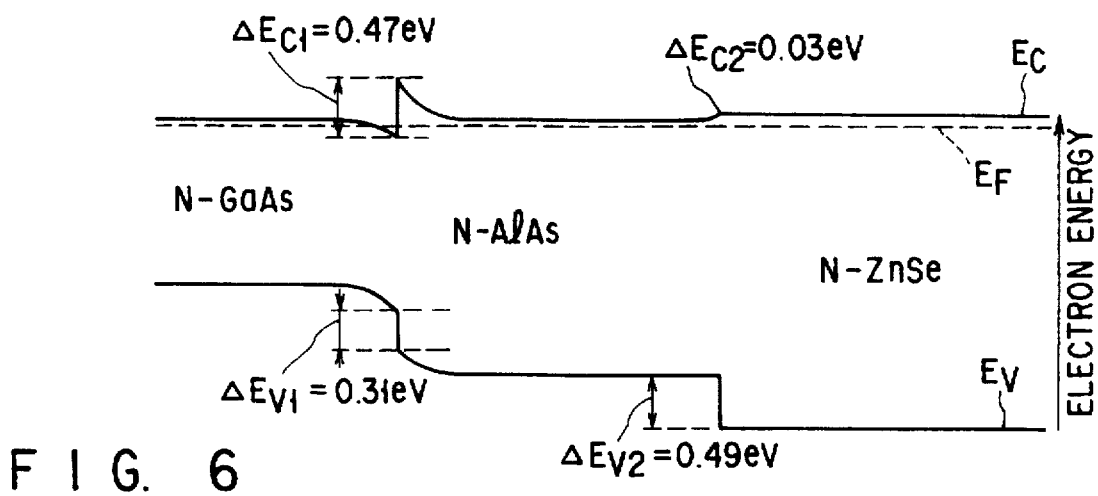
F I G. 6

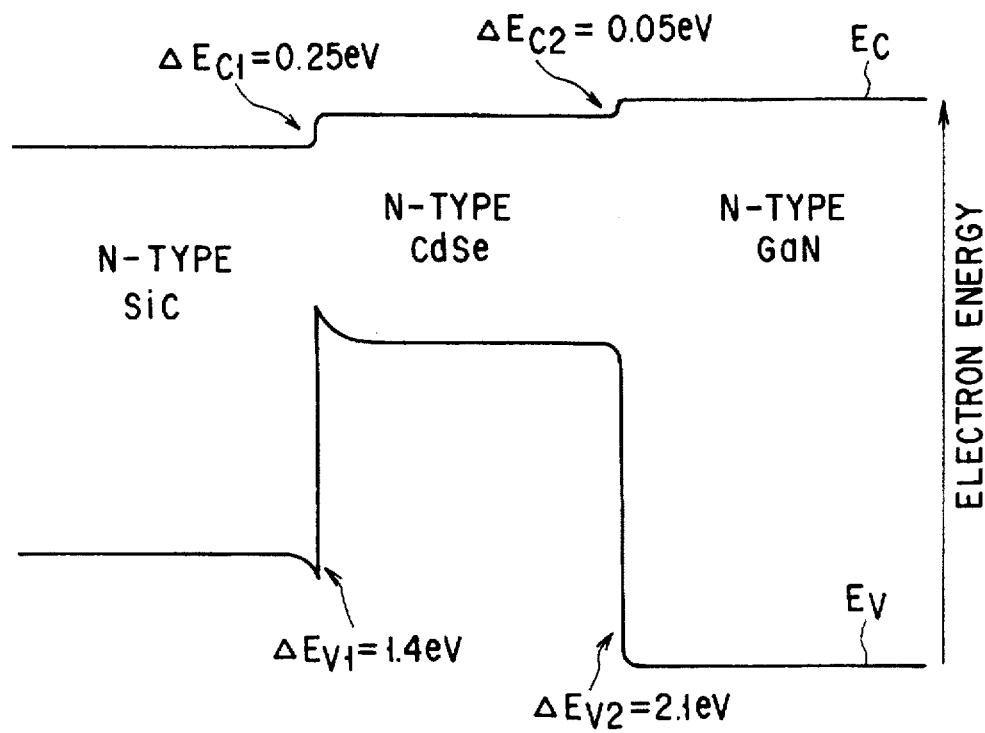
F I G. 12
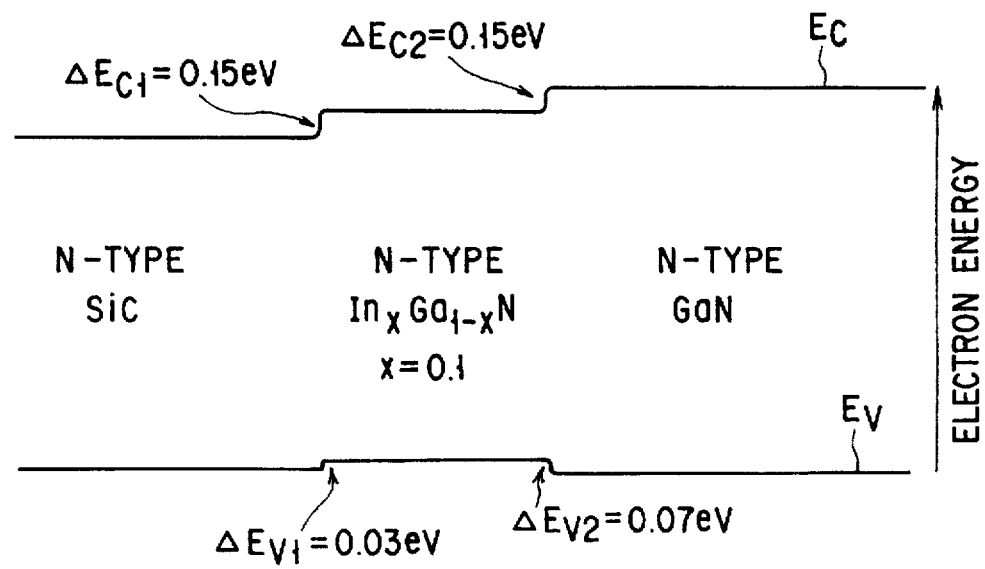
F I G. 13

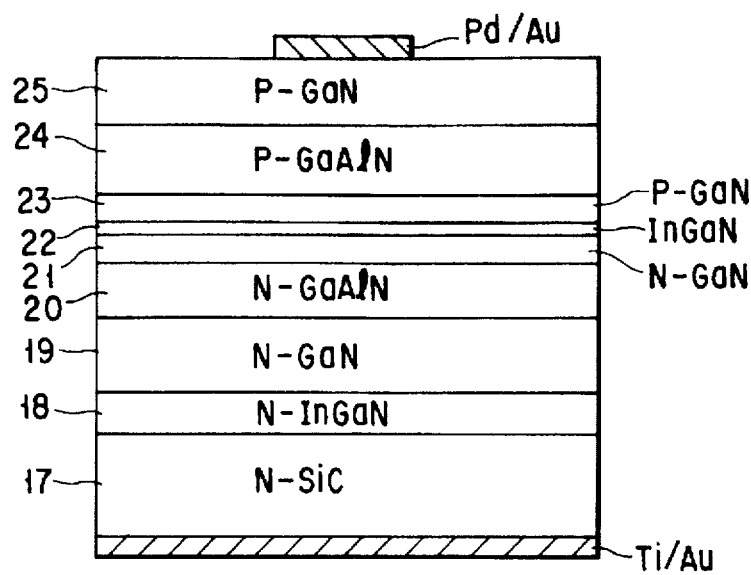
F I G. 18
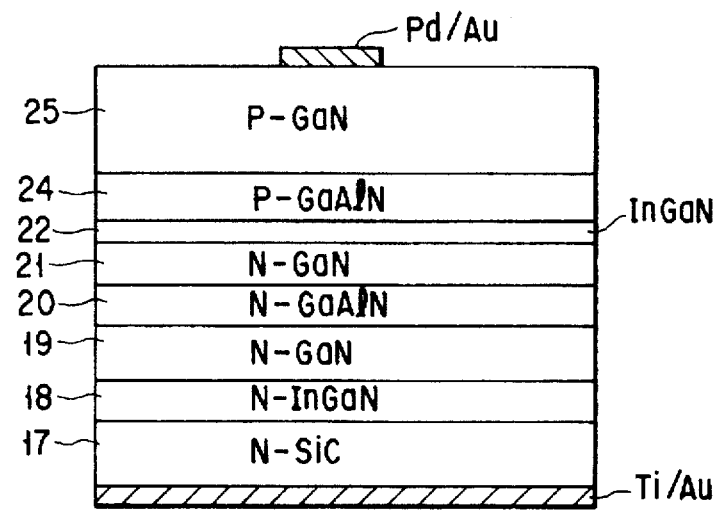
F I G. 19
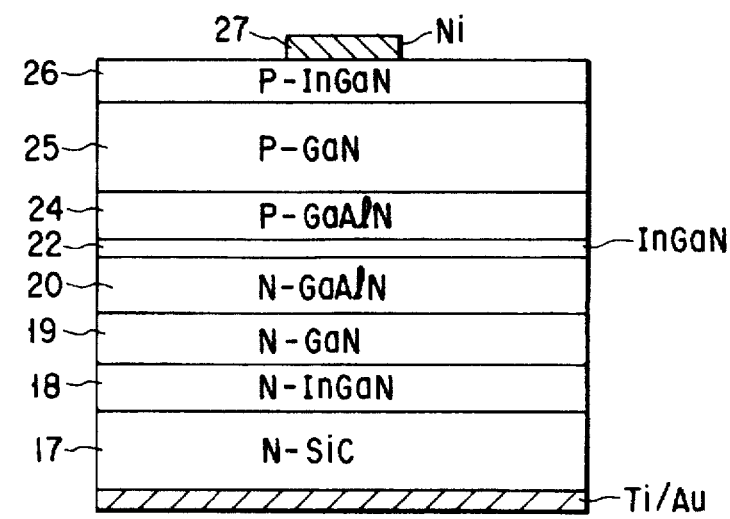
F I G. 20

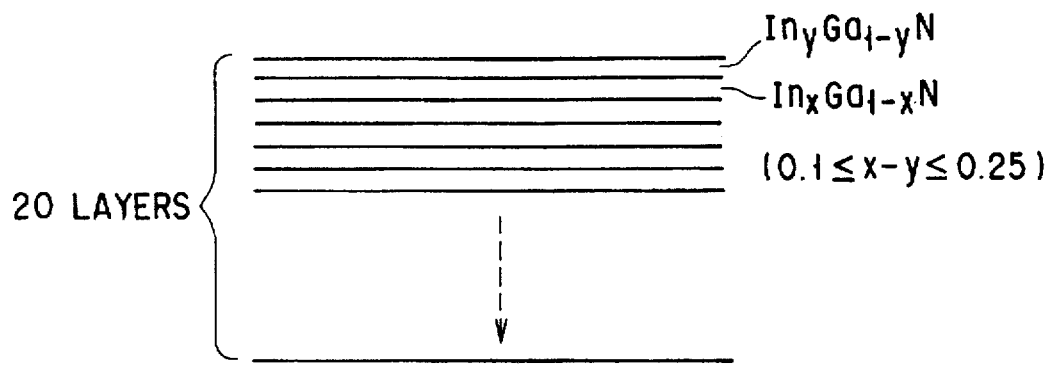
F I G. 24A
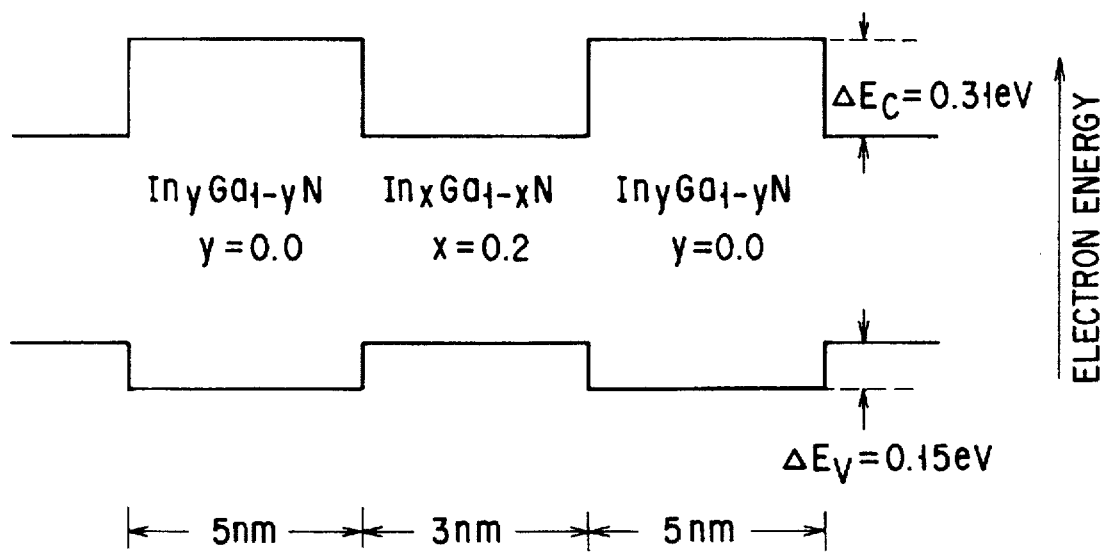
F I G. 24B

MULTILAYER STRUCTURED SEMICONDUCTOR DEVICES

BACKGROUND OF THE INVENTION

1. Field of the Invention

This invention relates to improvements in the performance and reliability of ZnSe- and GaN-based multilayer structured semiconductor laser devices and light-emitting diodes. This invention also relates to improvements in the high-power output and manufacturing cost of GaN-based laser devices and light-emitting diodes achieved by applying the invention to the substrate structure of the GaN and ZnSe-based laser devices and light-emitting diodes.

2. Description of the Related Art

The difficulty in the p-type doping of ZnSe led to a difficulty in forming a p-n junction, so that neither ZnSe-based blue laser devices nor ZnSe-based blue light-emitting diodes were put to practical use, although ZnSe had been expected to be a promising material for those devices and diodes. After the doping of active nitrogen into ZnSe succeeded in producing p-type ZnSe, the commercialization of ZnSe-based mixed crystal semiconductor devices became nearer to realization. At the beginning of the development of the devices, their operating voltages were very high, ranging from 40 V to 50 V, very different from the operating voltages of normally used semiconductor devices (1 to 2 V). The reason for this is that the upper valence band edge of a ZnSe-based mixed-crystal semiconductor device is very low, in terms of electron energy, and results in a very high contact resistance to the p-type ZnSe, and the resultant voltage drop across this barrier contributes to the excessive operating voltage.

To solve this problem, devices using semi-metal contacts, such as HgSe, or ZnSe-ZnTe graded superlattices as quasi-ohmic contacts to p-type ZnSe have been developed. However, even with those techniques the operating voltages of ZnSe-based mixed-crystal semiconductor devices are still as high as 7 V to 10 V, which means that they have to be further improved before they are put to practical use. To clarify the cause of the generation of the 5 V to 8 V, considered to be excess voltage, and to realize a practical device, various attempts have been made.

It has been considered that there is no discontinuity in the conduction band between n-type GaAs, serving as the substrate for a ZnSe-based mixed-crystal semiconductor device, and an n-type ZnSe layer grown onto the n-type GaAs, and thus no barrier exists to electron conduction in the direction perpendicular to the interface.

For example, in J. Ren et al., J. Cryst. Growth, 138 (1994) p. 455 and L. Kassel et al., Appl. Phys. Lett., 56 (1990) p. 42, it has been concluded that a band offset in the conduction band between GaAs and ZnSe is zero. In A. D. Katnani et al., Phys. Rev. B, Vol. 28, No. 4 (1988) p. 1944 and S. P. Kowakzyk et al., J. Vac. Sci. Technol., 21 (1982) p. 482, it has been concluded that the band offset is 0.2 eV.

Specifically, it has been considered that as shown in FIG. 1, at the junction between n-type GaAs and n-type ZnSe, the band offset exists mainly in the valence band and only an almost negligible discontinuity of about 0 to 0.2 eV is present in the conduction band.

The roles of buffer layers presently used in growing ZnSe on a GaAs substrate are only to reduce the density of point defects, caused in the grown ZnSe layer, and stacking faults leading to the device breakdown. Therefore, a method of performing the epitaxial growth of GaAs or InAs on a GaAs substrate as a buffer layer has been used.

The problem of the presence of an excessive ohmic voltage drop in ZnSe-based multilayer structured semiconductor devices contributes greatly to a decrease in the performance of current-injection laser devices and light-emitting diodes. Although GaN, like ZnSe, had been thought to be a promising material for blue laser devices and light-emitting diodes, a bulk semiconductor substrate presenting excellent ohmic characteristics at the interface with the grown layer has not been found, so that insulating sapphire, even with its large lattice mismatch, has been used for substrates for epitaxial growth. Since sapphire is insulating material, both of the electrical terminals are provided on the surface side of the device. This not only makes it difficult to achieve a low-voltage and high-current operation leading to a high-power operation, but also gives rise to a productivity problem and a high manufacturing cost problem.

SUMMARY OF THE INVENTION

An object of the present invention is to reduce the operating voltage of ZnSe-based laser devices and light-emitting diodes remarkably and thereby improve the performance of the devices by re-evaluating the effect of a buffer layer from the viewpoint of electron conduction on the basis of the fact that a discontinuity in the conduction band between n-type GaAs and n-type ZnSe, which was ignored in the prior art, is larger than was expected at first and contributes to an excessive operating voltage in the ZnSe-based laser devices and light-emitting diodes.

Another object of the present invention is to realize a multilayer structure excellent in crystallinity and thereby achieve a longer service life of the devices by reducing the density of point defects developing at the interface between a GaAs substrate and a ZnSe epitaxial layer by the use of a buffer layer.

Still another object of the present invention is to improve the performance and service life of the devices by re-evaluating the effect of a buffer layer from the viewpoints of electron conduction and crystallinity in connection with the promising GaN-based material for blue laser devices and light-emitting diodes, similarly to the ZnSe-based material.

In the present invention, when the explanation centers on the electrical properties, the buffer layer is referred to as an intermediate layer to make a distinction from a case where the buffer layer is used to reduce the defect density.

In the explanation below, suffixes indicating the composition of a mixed-crystal compound semiconductor are assigned only to components indispensable to the explanation of the present invention. The other ordinary component parts are indicated just by combinations of element symbols.

A multilayer structured semiconductor device according to the present invention is characterized by comprising: a first n-type compound semiconductor layer containing GaAs; a second n-type compound semiconductor layer containing ZnSe; and at least one intermediate layer that is composed of an n-type compound semiconductor layer and provided between the first and second n-type compound semiconductor layers, wherein the energy value at the conduction band edge that the n-type intermediate layer has lies between the energy values at the conduction band edges of the first and second n-type compound semiconductor layers adjoining both faces of the intermediate layer, which thereby reduces the operating voltage of the multilayered semiconductor device.

The intermediate layer is characterized by being composed of an n-type $Al_xGa_{1-x}As$ layer, with the value of composition x being in the range of $0.2<x\leq1$, preferably $x=0.35$, and each having a constant value of x of its own. The intermediate layer is characterized by being an n+-type AlAs layer or at least one n+-type $Al_xGa_{1-x}As$ layer doped with high-concentration donors of $1\times10^{18} cm^{-3}$ or more, with the value of composition x being in the range of $0.6<x<1.0$, preferably $x=0.7$, and each having a constant value of x of its own.

The intermediate layer is characterized by being composed of at least one n-type $Cd_xZn_{1-x}Se$ layer, with the value of composition x being in the range of $0.05<x<0.3$, preferably $x=0.1$, and each having a constant value of x of its own.

The intermediate layer is characterized by being composed of at least one n-type $Al_xGa_{1-x}As$ layer formed on the n-type GaAs side and at least one n-type $Cd_yZn_{1-y}Se$ layer formed on the n-type ZnSe side, the value of composition x in the n-type $Al_xGa_{1-x}As$ layer being a constant layer by layer and when the number of the n-type $Al_xGa_{1-x}As$ layers is plural, increasing in such a manner that the value of x in one layer is larger than that in the preceding one in the direction from the GaAs side toward the ZnSe side, and the value of composition y in the n-type $Cd_yZn_{1-y}Se$ layer is a constant layer by layer and when the number of the n-type $Cd_yZn_{1-y}Se$ layers is plural, decreasing in such a manner that the value of y in one layer is smaller than that in the preceding one in the direction from the GaAs side toward the ZnSe side.

Furthermore, the intermediate layer may be composed of a first intermediate layer consisting of a single n-type $Al_xGa_{1-x}As$ layer formed on the n-type GaAs layer side, the value of composition x varying with thickness and a second intermediate layer consisting of a single n-type $Cd_yZn_{1-y}Se$ layer formed on the ZnSe side, the value of composition y varying with thickness, the first intermediate layer being an n-type $Al_xGa_{1-x}As$ layer in which the value of x increases continuously from the junction surface with the GaAs with thickness, and the second intermediate layer being an n-type $Cd_yZn_{1-y}Se$ layer in which the value of y decreases continuously from the junction surface with the n-type $Al_xGa_{1-x}As$ layer to the junction surface with the ZnSe with thickness.

A multilayered semiconductor device of the present invention is characterized by comprising: a first n-type compound semiconductor layer containing SiC; a second n-type compound semiconductor layer containing either a GaN layer or an $In_xGa_{1-x-y}Al_yN$ ($0<x, y, x+y<1$) layer; and at least one intermediate layer that is composed of an n-type compound semiconductor layer and provided between the first and second n-type compound semiconductor layers, wherein the energy value at the conduction band edge that the at least one intermediate layer has lies between the energy values at the conduction band edges of the first and second n-type compound semiconductor layers adjoining both faces of the intermediate layer.

The intermediate layer is characterized by being composed of at least one n-type $CD_zSe_{1-z}$ layer, with the value of composition z being in the range of $0\leq z\leq 1$, preferably any one of $z=0$, $z=0.5$, and $z=1$, and each having a constant value of z of its own.

The intermediate layer is characterized by being composed of at least one n-type $In_zGa_{1-z}N$ layer, with the value of composition z being in the range of $0<z<0.15$, preferably $z=0.1$, and each having a constant value of z of its own.

The intermediate layer is characterized by being composed of at least one n-type $In_zAl_{1-z}N$ layer, with the value of composition z being in the range of $0.7<z<1$, preferably $z=0.8$, and each having a constant value of z of its own.

The intermediate layer may be composed of at least one n-type $(AlN)_z(SiC)_{1-z}N$ layer, with the value of composition z being in the range of $0.25<z<0.45$, preferably $z=0.35$, and each having a constant value of z of its own.

A multilayered semiconductor device of the present invention is characterized by comprising: a p-type GaN layer; an Ni electrode layer; and at least one intermediate layer that is composed of p-type $In_xGa_{1-x}N$ and provided between the p-type GaN layer and the Ni electrode layer, with the value of composition x being in the range of $x>0.3$, preferably $x=0.35$.

A multilayered semiconductor device of the present invention is characterized by comprising: a first compound semiconductor layer of composition x composed of $In_xGa_{1-x}N$; a second compound semiconductor layer of composition y composed of $Ga_yAl_{1-y}N$ of the same conductivity type as that of the first compound semiconductor layer; an intermediate layer that is of the same conductivity type as that of the first and second compound semiconductor layers and is composed of GaN formed adjacent to the first compound semiconductor layer; and an intermediate layer of composition z that is of the same conductivity type as that of the first and second compound semiconductor layers and is composed of at least one $Ga_zAl_{1-z}N$ formed between the intermediate layer composed of GaN and the second compound semiconductor layer, wherein the value of composition x in the first compound semiconductor layer is in the range of $0.05<x<0.15$, preferably $x=0.1$, and the value of z in the intermediate layer composed of $Ga_zAl_{1-z}N$ is a constant in the range of $1>z>y$ for each layer.

The first compound semiconductor layer is characterized by being formed adjacent to an insulating substrate.

A multilayered semiconductor device of the present invention is characterized by comprising: a first compound semiconductor layer composed of GaN; a second compound semiconductor layer of composition x composed of $Ga_xAl_{1-x}N$ of the same conductivity type as that of the first compound semiconductor layer; and at least one intermediate layer of composition y composed of $Ga_yAl_{1-y}N$ of the same conductivity type as that of the first and second compound semiconductor layers, wherein the intermediate layer has a constant value of composition y in the range of $1>y>x$ of its own layer by layer.

The first compound semiconductor layer is characterized by being formed successively on a $Ga_zAl_{1-z}N$ layer with the value of composition z being in the range of $0.8<z<0.99$, preferably $z=0.9$, formed adjacent to an insulating substrate.

A multilayered semiconductor device of the present invention is characterized by comprising: an active layer where a plurality of thin layers composed of $In_xGa_{1-x}N$ with the value of composition x being in the range of $0.15<x<0.3$, preferably $x=0.2$, and thin layers composed of $In_yGa_{1-y}N$ (where $x>y$) are stacked one on top of another alternately, and by being formed on an insulating substrate.

The active layer may be composed of a single $In_xGa_{1-x}N$ thin layer, adjoining the top and bottom faces of which an optical guide layer composed of GaN is formed.

A multilayered semiconductor device of the present invention is characterized by comprising: a first compound semiconductor layer; a second compound semiconductor layer; and at least one intermediate layer that is composed of a compound semiconductor layer and provided between the first and second compound semiconductor layers, wherein the thickness t of the intermediate layer is set in the range of 100 nm>t>10 nm, preferably in the range of 100 nm>t>30 nm, under the conditions where $a_3>a_1$ and $a_3>a_2$ hold with the lattice constants of the first and second compound semiconductor layers being $a_1$ and $a_2$, respectively, and the lattice constant of the intermediate layer being $a_3$.

The first compound semiconductor layer is characterized by being a GaAs layer, the second compound semiconductor layer is characterize by being a ZnSe layer, and at least one intermediate layer composed of the compound semiconductor layer is characterized by being preferably $Al_xGa_{1-x}As$ with composition x being 0.4.

An intermediate layer that meets the expressions $a_3 < a_1$, and $a_3 < a_2$ with the lattice constants of the first and second compound semiconductor layers being $a_1$ and $a_2$, respectively, and the lattice constant of the intermediate layer being $a_3$, may be provided between the first and second compound semiconductor layers.

At this time, the first compound semiconductor layer may be a GaAs layer, the second compound semiconductor layer may be a ZnSe layer, and at least one intermediate layer composed of the compound semiconductor layer may be preferably $In_xGa_{1-x}As$ with composition x being 0.3.

When an epitaxial layer of different group elements is grown on a compound semiconductor substrate or on a substrate where a compound semiconductor of the same group elements is formed on a compound semiconductor substrate, a barrier is caused between them due to discontinuity in the energy band. The difficulty with high-concentration doping particularly contributes to excessive voltage drops in a multilayered semiconductor laser device and light-emitting diodes, preventing high-power operation.

In the case of the n-type, for example, by inserting a single or plurality of n-type compound semiconductors as intermediate layers, their conduction band edges lying between the energy values at the conduction band edges of the n-type compound semiconductors adjacent to the intermediate layers, discontinuities caused in the conduction band are minimized, which reduces the excessive voltages remarkably, not the voltages necessary for the operation of the active regions of the laser device and light-emitting diode, thereby improving the performance and reliability of the device and diode.

Furthermore, the structure of a GaN-based multilayered semiconductor laser and light-emitting diode on a conductive substrate using the intermediate layer and an insulating substrate and the structure of an active layer capable of highly efficient lasing will be explained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 shows a band structure of a GaAs-ZnSe hetero-interface;

FIG. 5 is a band structure diagram to help explain the effect of an AlGaAs intermediate layer;

FIG. 6 is a band structure diagram to help explain the effect of an AlAs intermediate layer;

FIG. 12 is a band structure diagram to help explain the effect of a CdSe intermediate layer of the fourth embodiment;

FIG. 13 is a band structure diagram to help explain the effect of an InGaN intermediate layer of the fourth embodiment;

FIG. 18 is a sectional view of a GaN-based laser device using an n-type InGaN intermediate layer;

FIG. 19 is another sectional view of the GaN-based laser device using an n-type InGaN intermediate layer;

FIG. 20 is a sectional view of a GaN-based laser device using an n-type InGaN intermediate layer and a p-type InGaN intermediate layer;

FIG. 24A is a sectional view of an MQW laser active layer in a sixth embodiment of the present invention; and FIG. 24B shows an electronic energy structure of a section of the MQW laser active layer.

DETAILED DESCRIPTION OF THE PREFERRED EMBODIMENTS

Hereinafter, referring to the accompanying drawings, a first embodiment of the present invention will be explained.

Figure 2:
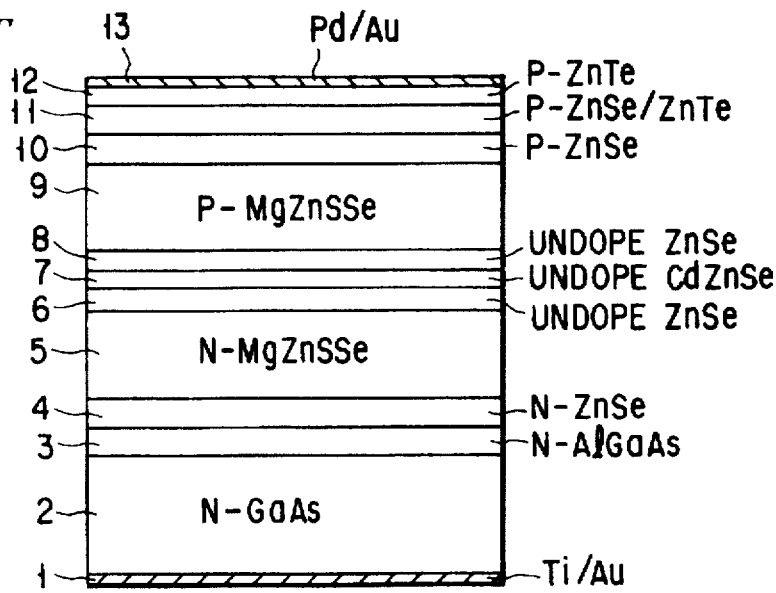
FIG. 2 is a sectional view of a laser device according to a first embodiment of the present invention.

FIG. 2 is a sectional view of a blue semiconductor laser device having an intermediate layer provided between a GaAs substrate and a ZnSe-based multilayer structure. The main section of the blue semiconductor laser device comprises a CdZnSe active layer 7, ZnSe optical guide layers 6, 8 grown on the top and bottom of the active layer, and MgZnSSe cladding layers 5, 9 grown on the top and bottom of the guide layers.

In FIG. 2, if the ZnSe optical guide layers 6, 8 are eliminated, a blue semiconductor light-emitting diode will be obtained.

The MgZnSSe cladding layer has a large forbidden band gap, helping effect carrier confinement and optical confinement in the active layer. To provide a low-resistance ohmic contact to the p-type MgZnSSe cladding layer 9, a p-type ZnSe 10, a p-type ZnSe/ZnTe superlattice 11, and a p-type ZnSe contact layer 12 are formed one on top of another on the cladding layer 9 in that order. On the contact layer 12, a Pd/Au ohmic electrode 13 is formed. To provide a low-resistance ohmic contact on the n-type MgZnSSe cladding layer 5, an n-type ZnSe layer 4 is formed on the bottom of the cladding layer 5.

An object of the present invention is to remarkably decrease the large voltage drop caused between the n-type ZnSe layer 4 and the n-type GaAs substrate 2 by forming n-type AlGaAs 3 as an intermediate layer and thereby prevent an excessive voltage extraordinarily larger than the necessary voltage for operating the active layer in the laser device or light-emitting diode from being generated between a Ti/Au ohmic electrode 1 formed on the GaAs substrate and the Pd/Au ohmic electrode 13.

The n-type AlGaAs layer may be used as a contact layer between the metal electrode and the n-type ZnSe layer. For instance, as shown in FIG. 3, an n-type AlGaAs layer 3 and an n-type GaAs layer 16 may be stacked one on top of another between the n-type ZnSe 4 and the Ti/Au electrode 1 to produce a low-resistance ohmic contact.

Figure 3:
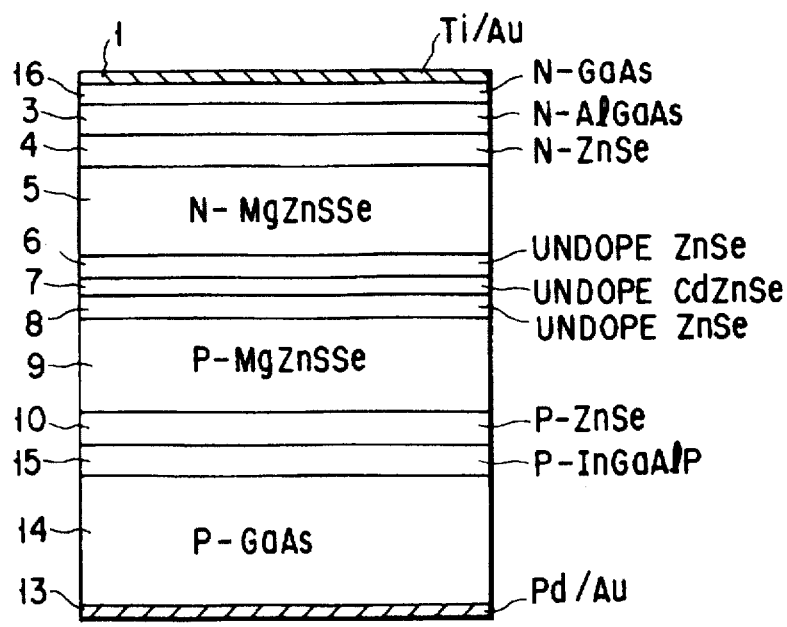
FIG. 3 is a sectional view of a laser device having an n-type AlGaAs intermediate layer formed below a Ti/Au electrode.

In FIG. 3, a p-type InGaAlP is a buffer layer usually used in growing p-type ZnSe on a p-type GaAs substrate.

Figure 1:
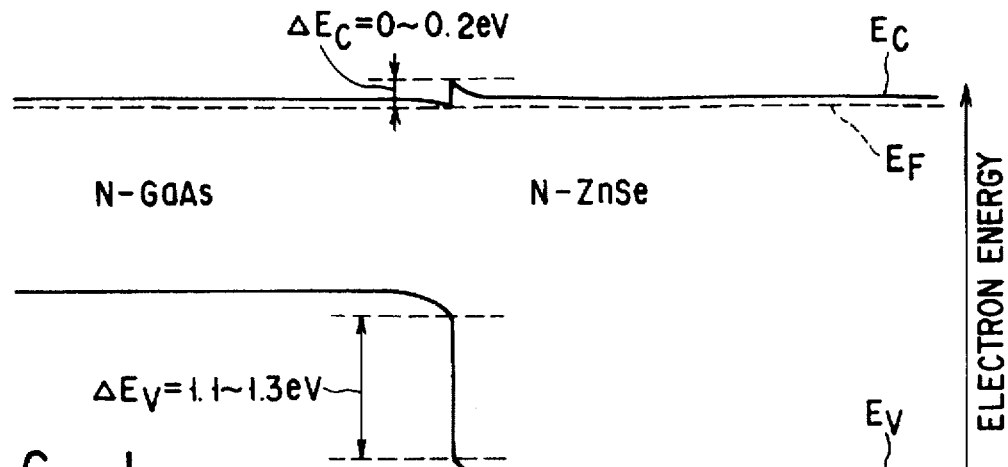
FIG. 1 shows the accepted band structure of a conventional GaAs-ZnSe hetero-interface.

As described earlier using FIG. 1, it has been considered that a band offset between ZnSe and GaAs exists mainly in the valence band and the conduction band has only a barrier of about 0 eV to 0.2 eV. In the prior art, the barrier was considered to be almost zero and therefore, no resistance would be caused by the barrier in that portion, when electron current was allowed to flow from n-type GaAs to n-type ZnSe. Actually, however, as shown in FIG. 4, a band offset between ZnSe and GaAs has developed in the conduction band as well and the amount of the offset is as large as 0.5 eV. By setting the donor impurity concentration at $1\times10^{18}$ $cm^{-3}$, the effect of the potential barrier thus formed in the conduction band can be removed as a result of an increase in the tunnel current component.

Such heavily donor impurity doping is effected by doping a large amount of chlorine to ZnSe. At this time, the surface of the GaAs substrate is affected by chlorine before and in the course of the growth of a ZnSe layer. Furthermore, too many point defects occur at the ZnSe layer on the GaAs substrate, impairing the crystallinity of the ZnSe layer significantly. This makes it very difficult to grow ZnSe having a high donor impurity concentration on GaAs. Therefore, the barrier height of 0.5 eV is high enough to prevent electrons from freely flowing from the n-type GaAs substrate to the n-type ZnSe layer.

A method of using an n-type $Al_xGa_{1-x}As$ intermediate layer 3 between the n-type GaAs substrate 2 and the n-type ZnSe layer 4 as shown in FIG. 2 to make easier the flow of electrons into the n-type ZnSe layer 4, will be explained using a band structure diagram.

FIG. 5 shows a state where a band offset occurs for Al composition x=0.35. As described earlier, since the discontinuity in the conduction band between GaAs and ZnSe reaches 0.5 eV, even if $Al_xGa_{1-x}As$ is used as an intermediate layer in the range of Al composition x<0.2 the electrical properties of the boundary will not be improved. Means for eliminating a discontinuity in the conduction band by increasing Al composition x from 0 to 0.13 gradually, starting from GaAs toward ZnSe, has been disclosed in Jpn. Pat. Appln. KOKAI Publication No. 61-46031. Because the means used is in the range of x<0.2, it does not produce a practical effect.

To produce a sufficient effect by using an n-type $Al_xGa_{1-x}As$ intermediate layer 3 having uniform composition x, the expression 0.2<x must be met. $Al_xGa_{1-x}As$ becomes an indirect band gap semiconductor in the range of 0.4<x<1.0. No problem occurs in using the indirect band gap semiconductor as an intermediate layer to reduce a barrier to electron conduction. The indirect band gap semiconductor accomplishes the purpose of reducing the contact resistance sufficiently.

When $Al_xGa_{1-x}As$ with x=0.35 is used as an intermediate layer, a barrier of 0.21 eV occurs at the boundary of the conduction band between the intermediate layer and ZnSe layer. Electrons can overcome a barrier of that height easily due to their thermal energy at room temperature. At the boundary between the GaAs substrate and $Al_xGa_{1-x}As$, a slightly higher barrier of 0.29 eV develops. Because with an Al composition of x=0.35, donors of $1\times10^{18}$ $cm^{-3}$ can be doped easily into $Al_xGa_{1-x}As$ intermediate layer, electrons can pass through the barrier by the tunnel effect without causing resistance at the boundary.

Here, the ease of doping in $Al_xGa_{1-x}As$ depends on Al composition x. A deep trapping level called a DX center exists in the range of 0.4<x<0.6. In this composition range, it is difficult to achieve high-concentration donor impurities. Since the Al composition of x=0.35 does not lie in this range, donors in the range $1\times10^{18}$ $cm^{-3}$ can be doped in $Al_xGa_{1-x}As$.

When an AlGaAs intermediate layer is used, the interface between GaAs and AlGaAs is much smoother than when ZnSe is grown directly on GaAs. The interface between AlGaAs and ZnSe is less smooth than the interface with GaAs. Since a discontinuity in the conduction band between AlGaAs and ZnSe can be made smaller from the viewpoint of electrons, use of an AlGaAs intermediate layer produces a smooth, low-resistance ohmic junction.

Although the interface between AlGaAs and ZnSe is a little inferior in smoothness, it is much smoother than a conventional interface whereby ZnSe is grown directly on GaAs. The reason for this is that the smaller barrier in the conduction band between AlGaAs and ZnSe enables the doping concentration of chlorine donors to be lowered and the corresive effects are remarkably reduced as compared with that in the prior art.

As described above, to decrease the potential barrier between n-type GaAs and n-type ZnSe, an intermediate layer made of single n-type $Al_xGa_{1-x}As$ with x being in the range of 0.2<x<0.4, and preferably a constant value of x=0.35, is inserted between them. In this case, by providing a plurality of intermediate layers and setting x at a constant value in the range of 0.2<x<0.4 for each layer, in such a manner that the value of x in one layer is larger than that in the preceding one, starting from the n-type GaAs side toward the n-type ZnSe side, the potential barrier is reduced more effectively.

With the n-type $Al_xGa_{1-x}As$, the chlorine donors are not compensated by the DX centers with x being in the range of $0.6<x<1$, so that a low-resistance ohmic contact can be obtained by making an intermediate layer out of n+-type Al $Ga_xGa_{1-x}As$ with an electron concentration of $1\times10^{18}$ cm$^{-3}$ in this Al composition x range. At x=0.7, the best result is obtained. In this case, by providing a plurality of intermediate layers and setting x at a constant value in the range of $0.6<x<1$ for each layer in such a manner that the value of x in one layer is larger than that in the preceding one, starting from the n-type GaAs side toward the n-type ZnSe side, the potential barrier is reduced more effectively.

Furthermore, with a plurality of intermediate layers, the value of x may be set at a constant value for each layer in the range of $0<x<1$ and the value of x other than that in the range of $0.4<x<0.6$, where the DX center compensate the chlorine donors, may be selected.

FIG. 6 shows a state where a band offset occurs when Al composition in $Al_xGa_{1-x}As$ is made extremely large up to x=1, that is, when AlAs whose forbidden band gap is the largest amongst the AlGaAs alloys is determined to be a buffer layer. The advantage of this case is that a discontinuity in the conduction band between AlAs and ZnSe is so small that almost all the band discontinuity takes place between the GaAs substrate and AlAs. Since AlAs facilitates a high-concentration n-type doping, a low-resistance ohmic contact to n-type ZnSe can be obtained by forming AlAs into n+-type AlAs and allowing electrons to pass through the barrier that occurs in the conduction band between GaAs and AlAs by the tunnel effect.

The first embodiment of the present invention is characterized in that the value of x in $Al_xGa_{1-x}As$ is larger than in the prior art and $Al_xGa_{1-x}As$ having a constant value of x layer by layer is used as an intermediate layer. Since the intermediate layer is very liable to react with oxygen when AlGaAs has a large Al composition of x, care should be taken not to permit the buffer layer to be exposed to air before growing the ZnSe layer.

Figure 7B:
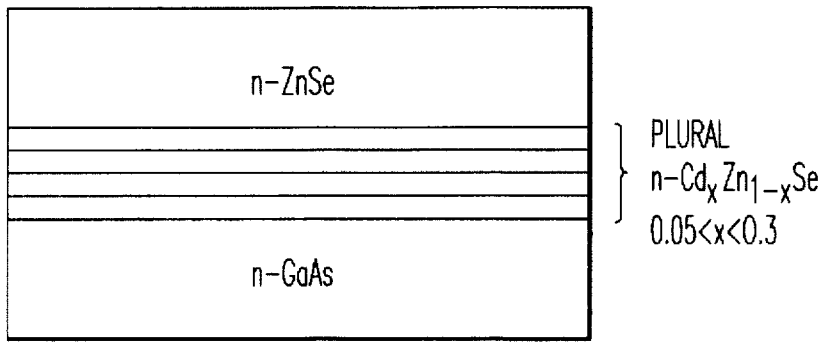
FIG. 7B is a sectional view of a structure with plural CdZnSe intermediate layers.
Figure 7A:
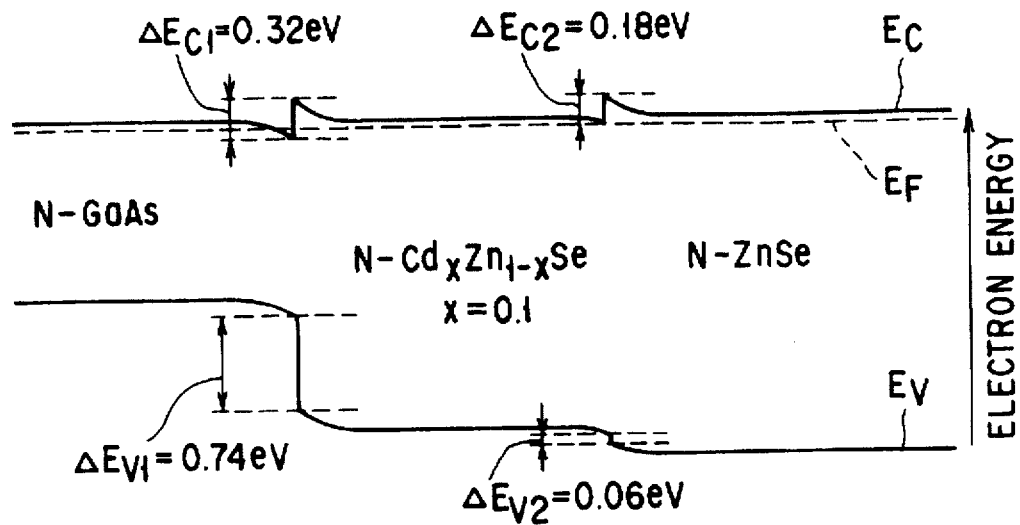
FIG. 7A is a band structure diagram to help explain the effect of a CdZnSe intermediate layer according to a second embodiment of the present invention.

Referring to FIG. 7A, a second embodiment of the present invention will be explained.

FIG. 7A shows a case where CdZnSe is used as an intermediate layer between a GaAs substrate and a ZnSe layer. In addition to the advantage of having the energy level value at the edge of the conduction band in a suitable position, the mixed crystal system has several other advantages. One advantage is that when CdZnSe is grown onto a GaAs substrate, Cd plays the role of passivating the GaAs surface during n-type doping by chlorine.

The damage to the GaAs surface by chlorine doping is much less than when ZnSe is grown directly on a GaAs substrate. As a result, the CdZnSe grown surface is smoother, which helps improve the crystallinity of a multilayer structured semiconductor device by epitaxial growth thereafter and consequently lengthen the service life of the device. Another advantage is that the interface between CdZnSe and ZnSe is very smooth and therefore the electrical properties of the device is improved further.

The disadvantage of the $Cd_xZn_{1-x}Se$ intermediate layer is that the material does not lattice match with GaAs. The larger the value of x, the greater the degree of lattice mismatching. Therefore, the useful range of the intermediate layer is restricted to $0.05<x<0.3$ and the optimum thickness of the intermediate layer is limited to 20 nm to 5 nm according to the cadmium concentration.

When an n-type $Cd_xZn_{1-x}Se$ intermediate layer is used between an n-type GaAs substrate and an n-type ZnSe epitaxial layer, x=0.1 is the optimum value. For x=0.1, the band offset is as shown in FIG. 7. The difference in energy value between the intermediate layer and the ZnSe layer at the edge of the conduction band is reduced to 0.18 eV. If the n-type ZnSe has been doped suitably, the potential barrier can be overcome easily by the thermal energy of electrons at room temperature. A barrier of 0.32 eV develops between the intermediate layer and the GaAs substrate. The barrier of such magnitude can be similarly overcome by the thermal energy of electrons at room temperature. As a result, taking everything into consideration, use of the $Cd_xZn_{1-x}Se$ (x=0.1) buffer layer enables the resistance between GaAs and ZnSe to be reduced remarkably as compared with the present resistance.

When a plurality of n-type $Cd_xZn_{1-x}Se$ intermediate layers are used as shown in FIG. 7B, a far better result can be obtained by setting x at a constant value for each layer in such a manner that the value of x in one layer is smaller than that in the preceding one, staring from the n-type GaAs side toward the n-type ZnSe side.

Figure 8:
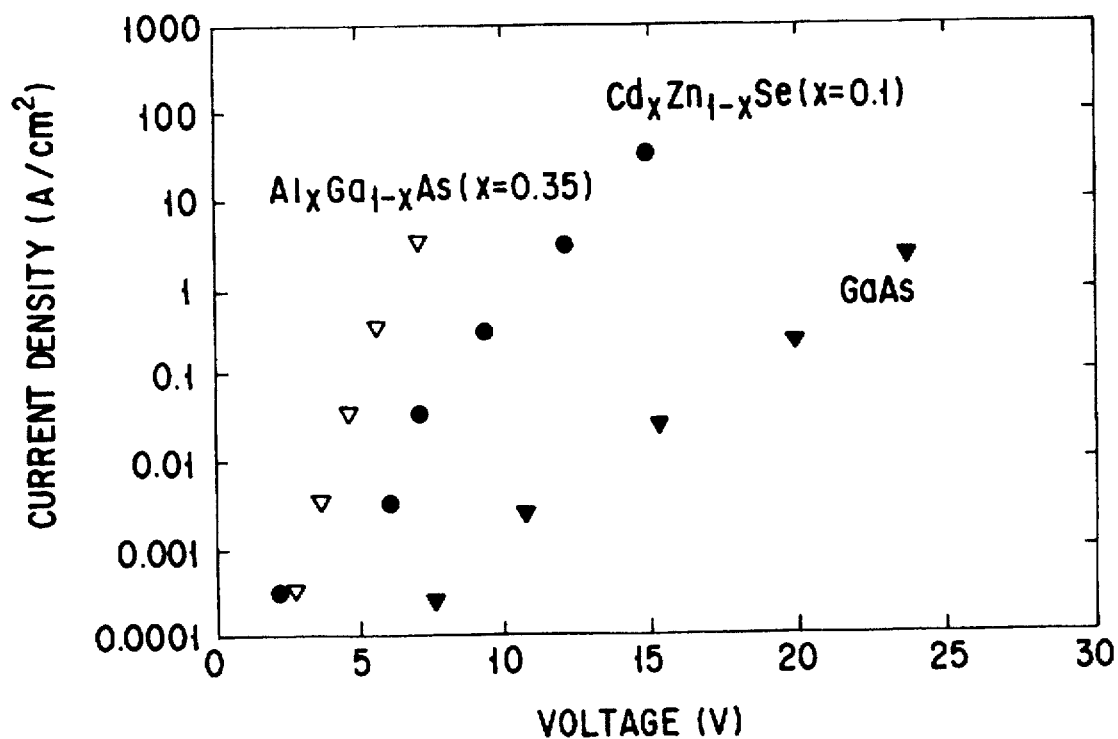
FIG. 8 is a diagram to help explain the effect of an intermediate layer reducing an excessive voltage in a laser device.

FIG. 8 shows improvements in the current-voltage characteristics of the device in a case where only either the $Al_xGa_{1-x}As$ intermediate layer (x=0.35) or the $Cd_xZn_{1-x}Se$ intermediate layer (x=0.1) is inserted in a ZnSe-based laser device formed on a GaAs substrate. In the figure, GaAs is a GaAs buffer layer grown on the GaAs substrate to improve the crystallinity of the epitaxial growth. This corresponds to a case where there is no intermediate layer. In contrast, in the case of a device having an AlGaAs intermediate layer or a CdZnSe intermediate layer, the operating voltage is small for the same current density, meaning that the generation of an excessive voltage has been reduced.

In this case, too, the intermediate layer is not a layer grown directly on the GaAs substrate, but a GaAs buffer layer is grown previously on the GaAs substrate before the epitaxial growth of an intermediate layer.

Figure 9:
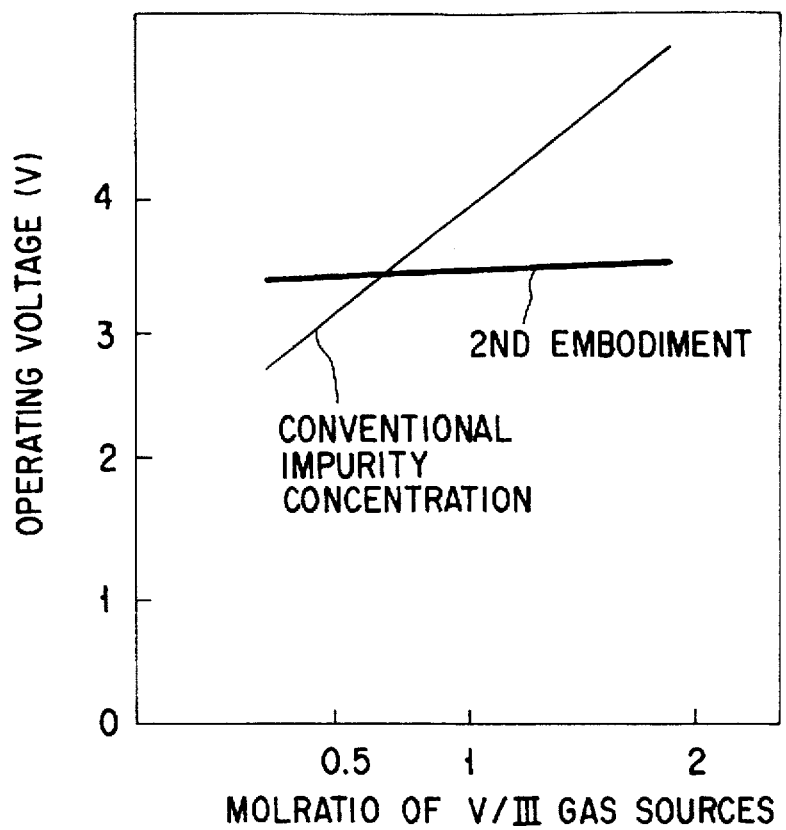
FIG. 9 is a diagram to help explain the comparison of the impurity concentration of the intermediate layer with the V/III molar ratio dependence of operating voltage.
Figure 11:
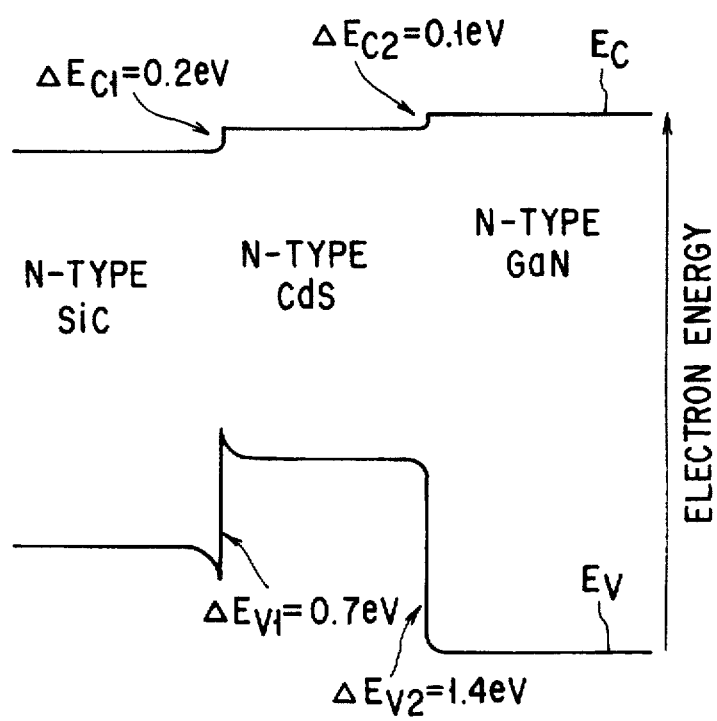
FIG. 11 is a band structure diagram to help explain the effect of a CD intermediate layer according to a fourth embodiment of the present invention.

During the formation of the intermediate layer, the interface with a compound semiconductor of a different group is formed at the top or bottom surface of the intermediate layer. At this time, a discontinuity in the band at the interface varies, depending on the growth conditions, so that the effect of the intermediate layer may not be sufficient. To avoid this problem, setting the impurity concentration of the intermediate layer in a high concentration range of $3\times10^{18}$cm$^{-3}$ to $1\times10^{19}$cm$^{-3}$ enables the operating voltage to be reduced, regardless of the growth conditions. FIG. 9 shows the relationship between the molar ratio of group V to group III elements in the incident material gas and the operating voltage during the epitaxial growth of an intermediate layer in a case where an AlGaAs intermediate layer is used.

The thick line shows a case where the impurity concentration of the intermediate layer is set in the high concentration range. From the thick line, it can be seen that an almost constant low operating voltage is obtained over a wide range of molar ratios, as compared with a conventional impurity concentration of about $10^{17}$cm$^{-3}$ shown by the thin line.

Figure 10B:
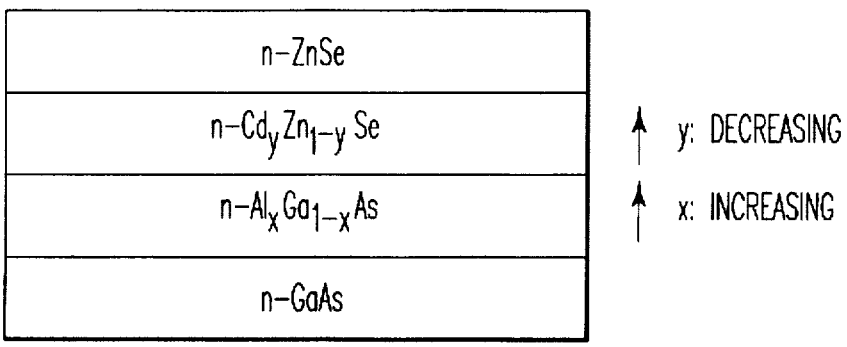
FIG. 10B is a sectional view of structure containing both AlGaAs, CdZnSe intermediate layers.
Figure 10C:
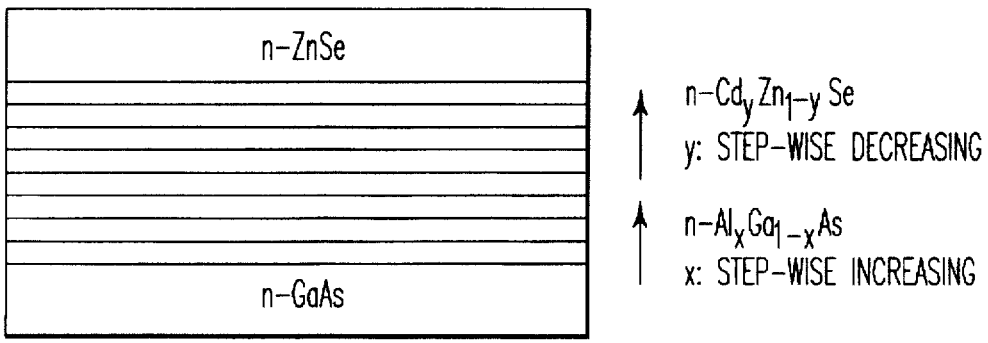
FIG. 10A is a band structure diagram to help explain the effect of AlGaAs, CdZnSe intermediate layers according to a third embodiment of the present invention.
Figure 10A:
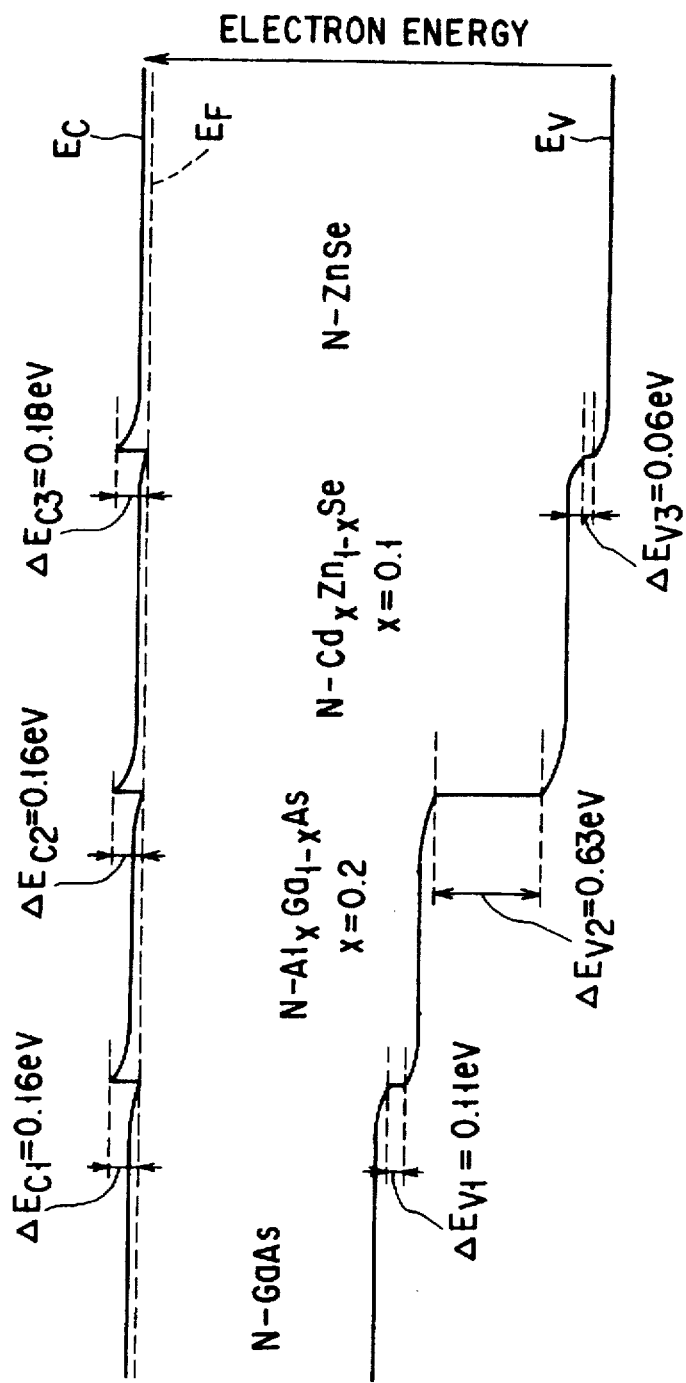
Figure 14:
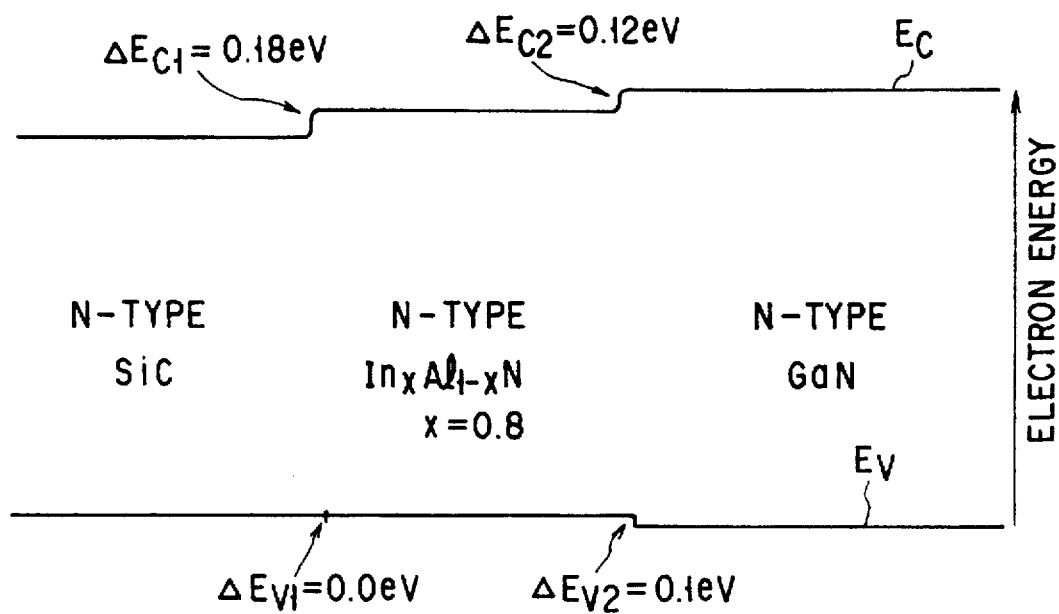
FIG. 14 is a band structure diagram to help explain the effect of an InAlN intermediate layer of the fourth embodiment.
Figure 15:
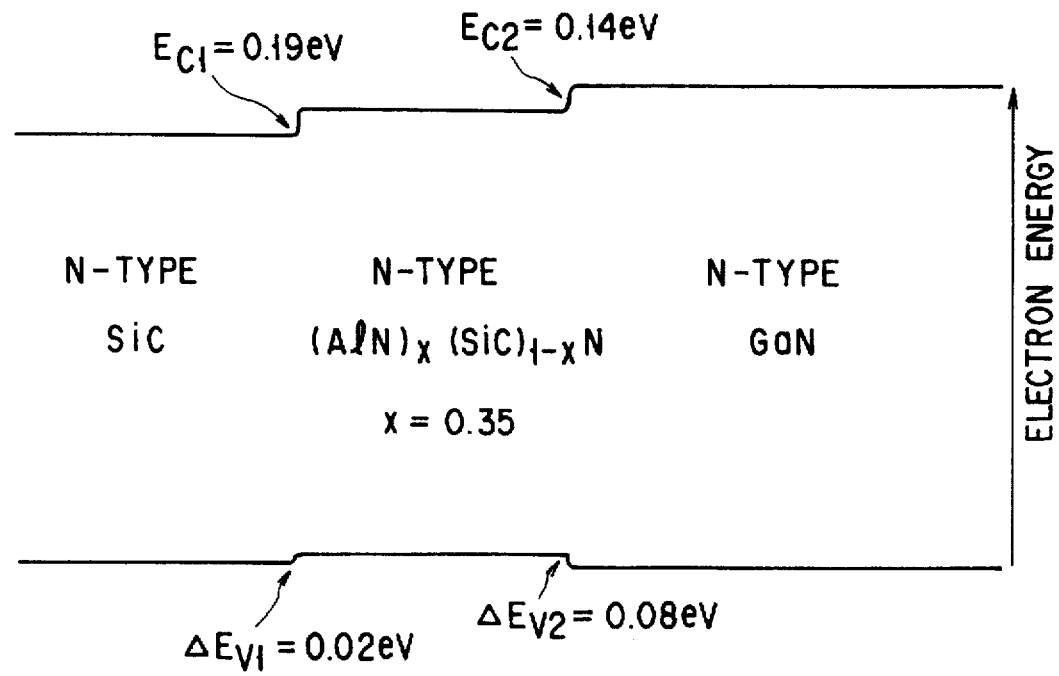
FIG. 15 shows a band structure of a device including an (AlN)(SiC)N intermediate layer of the fourth embodiment.

Referring to FIG. 10A, a third embodiment of the present invention will be explained. Although a device using a single type of mixed crystal as an intermediate layer has been described so far, combining two or more types of intermediate layers enables the resistance between n-type GaAs and n-type ZnSe to be reduced.

A method of using n-type $Al_xGa_{1-x}As$ (x=0.2) as a first intermediate layer and n-type $Cd_xZn_{1-x}Se$ (x=0.1) as a second intermediate layer adjacently. FIG. 10A shows a state where a band offset occurs between n-type GaAs and n-type ZnSe by this method. The height of a barrier developing at each boundary layer of the conduction band ranges from 0.16 eV to 0.18 eV, contributing greatly to the reduction of the operating voltage of the multilayer structured semiconductor device.

At this time, by increasing the value of x of the first intermediate layer gradually, starting at 0 in the portion adjacent to GaAs up to x=0.2 in the direction of thickness and then decreasing the value of x of the second intermediate layer, starting at x=0.1 down to x=0 in the portion adjacent to ZnSe as shown in FIG. 10B, three barriers in the conduction band of FIG. 10A are reduced to only one in the center, producing a better effect.

In this case, the value of x of the n-type $Al_xGa_{1-x}As$ acting as the first intermediate layer and that of the n-type $Cd_xZn_{1-x}Se$ acting as the second intermediate layer may be optimized so that the height of a barrier in the conduction band ($\Delta E_{C2}$ in FIG. 10A) may be minimized at the interface between them.

In the embodiment shown in FIG. 10C, the intermediate layer is characterized by being composed of at least one n-type $Al_{xGa1-x}As$ layer formed on the n-type GaAs side and at least one n-type $Cd_yZn_{1-y}Se$ layer formed on the n-type ZnSe side, the value of composition x in the n-type $Al_xGa_{1-y}As$ layer being a constant layer by layer and when the number of the n-type $Al_xGa_{1-x}As$ layers is plural, increasing in such a manner that the value of x in one layer is larger than that in the preceding one in the direction from the GaAs side toward the ZnSe side, and the value of composition y in the n-type $Cd_yZn_{1-y}Se$ layer is a constant layer by layer and when the number of the n-type $Cd_yZn_{1-y}Se$ layers is plural, decreasing in such a manner that the value of y in one layer is smaller than that in the preceding one in the direction from the GaAs side toward the ZnSe side.

Next, a structure using an intermediate layer to decrease the operating voltage of a GaN-based semiconductor laser device and light-emitting diode, according to a fourth embodiment of the present invention will be described.

First, FIGS. 11 to 16 show the effect of inserting into GaN based devices of a CD, CdSe, InGaN, InAlN, (AlN)(SiC)N, and CdSSe intermediate layers, with SiC being used as a GaN or InGaAlN epitaxial growth substrate. The conductivity types of these compound semiconductors are all the n-type. Since the intermediate layers shown in FIGS. 13 to 15 have the small band offsets on the valence band side, these intermediate layers can be used as buffer layers on the p-type side of the multilayer structure semiconductor device.

In a GaN-based blue laser device or blue light-emitting diode, sapphire serving as an insulating substrate is used as an epitaxial growth substrate. Because sapphire is expensive and both of the anode and cathode current terminals are drawn from the surface side of the device, a productivity problem and high-cost manufacturing problem are encountered in addition to the problem of decreasing the laser operating voltage.

To overcome these problems, a method of growing GaN on a conductive SiC substrate that is excellent in productivity was examined. Because an excessive voltage is developed at the boundary between SiC and GaN, this prevented practical devices from being put on the market.

To solve these problems, an n-type CD, CdSe, $In_xGa_{1-x}N$ (the optimum value is x=0.1 and the applicable range is 0<x<0.15), $In_xAl_{1-x}N$ (the optimum value is x=0.8 and the applicable range is 0.7<x<1), $(AlN)_x(SiC)_{1-x}N$ (the optimum value is x=0.35 and the applicable range is 0.25<x<0.45), and $Cd_xS_{1-x}Se$ (the optimum value is x=0.35 and the applicable range is 0<x<1) intermediate layers are provided on the n-type side of the device as shown in FIGS. 11 to 16, respectively, which thereby reduces the generation of excessive voltages remarkably.

Furthermore, by using a plurality of intermediate layers of the same type or of different types in the applicable range of x, a far better result can be obtained. At this time, the value of x for each layer may be constant or vary with thickness.

Figure 16:
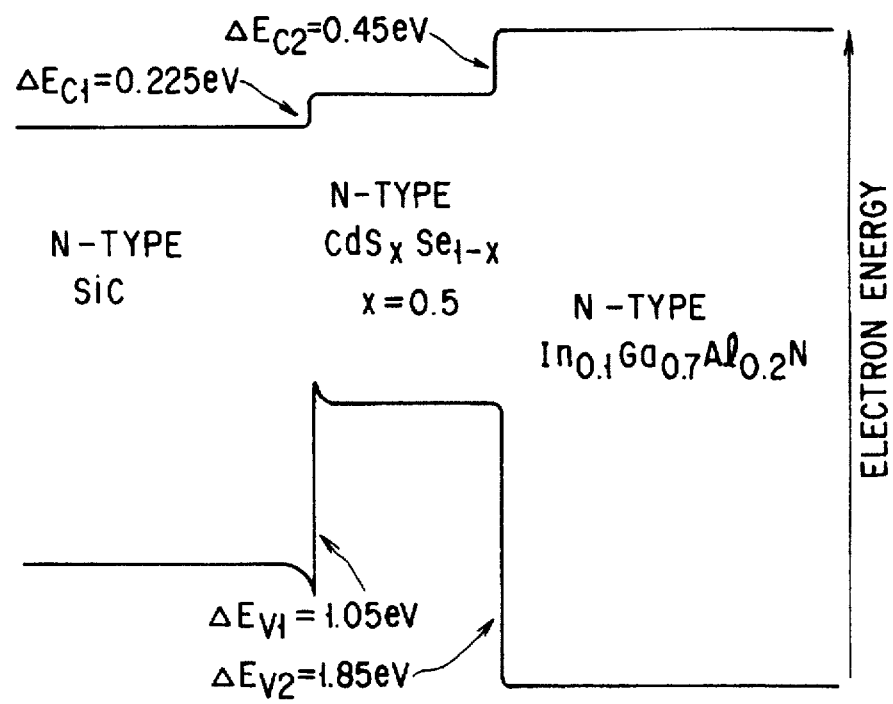
FIG. 16 shows a band structure of a device including a CdSSe intermediate layer of the fourth embodiment.

Although FIGS. 11 to 15 show the effect of an intermediate layer in the growth of GaN on an SiC substrate and FIG. 16 shows the effect of an intermediate layer in the growth of $In_xGa_{1-x-y}Al_yN$ (0<x, y, x+y<1) on an SiC substrate, these intermediate layers may be used for both GaN and $In_xGa_{1-x-y}Al_yN$ (0<x, y, x+y<1).

Figure 17:
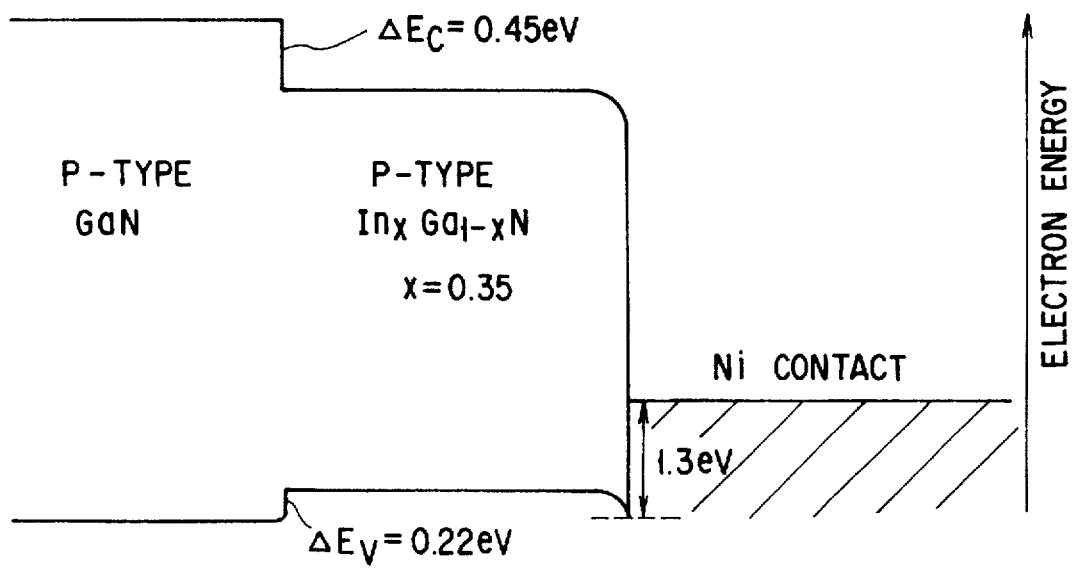
FIG. 17 shows a band structure in a case where InGaN is used as an intermediate layer between GaN and an Ni electrode.

The intermediate layers are also effective in a case where metal electrodes that have a small voltage drop due to the formation of a large schottry barrier with GaN. FIG. 17 shows a band structure in a case where p-type $In_xGa_{1-x}N$ (x=0.35) is used as an intermediate layer in forming an Ni electrode on p-type GaN. At this time, a discontinuity of 1.3 eV develops between Ni and p-type $In_xGa_{1-x}N$. The value is 0.22 eV lower than when Ni is jointed directly to p-type GaN. Such an improvement is made in the range of x>0.3.

To join GaN directly to a metal electrode, the GaN surface, previously grown at high temperatures, must be etched to remove the damaged surface layer caused during the high-temperature growth due to etch back processes immediately after growth is stopped. At present, the only effective GaN etching method is dry etching, which in removing the damaged surface layer causes similar damage itself. Because of this, the electrode portion has a large voltage drop.

The formation of an $In_xGa_{1-x}N$ (x=0.35) intermediate layer on GaN by the epitaxial method prevents such a damaged layer acting as an excessive barrier from occurring when an Ni electrode is joined to GaN, because the growth temperature is relatively low, ranging from 600° C. to 700° C. and at these temperatures etch back problems are greatly reduced. As described above, it is possible to make use of various intermediate layer materials to produce a metal electrode that has a small voltage drop with respect to GaN.

FIGS. 18 and 19 show sectional views of multilayer structures in a case where the intermediate layer of the fourth embodiment is applied to a GaN-based laser device on an SiC substrate. In those devices, InGaN is used as an active layer. In FIG. 18, a GaN optical guide layer 21 and GaAlN cladding layer 20 and a GaN optical guide layer 23 and GaAlN cladding layer 24 are provided on both sides of an InGaN active layer, respectively. Numeral 25 indicates the p-type GaN contact layer contacted by a Pd/Au electrode. In FIG. 19, a GaN optical guide layer 21 is provided only on the bottom of the InGaN active layer 22. The remaining configuration is the same as that of FIG. 18. The same parts as those of FIG. 18 are indicated by the same reference numerals. FIG. 20 is a sectional view of a multilayer structure used for a GaN-based light-emitting diode. In FIG. 20, GaAlN cladding layers 20, 24 are provided directly on both sides of the InGaN active layer 22.

In each of FIGS. 18 to 20, n-type $In_{xGa1-x}N$ (x=0.1) 18 is formed as an intermediate layer between an n-type SiC substrate 17 and an n-type GaN layer 19 as described above. In FIG. 20, in addition to this, a p-type $In_xGa_{1-x}N$ (x=0.35) intermediate layer 26 is provided between an Ni electrode 27 and a p-type GaN 25, thereby decreasing the voltage drop developed across an upper Ni electrode 27 and the p-type GaN layer.

Next, the decrease of the operating voltage of a GaN-based laser device using a sapphire substrate according to a fifth embodiment of the present invention will de described by reference to FIGS. 21 to 23. Use of a sapphire substrate has a productivity problem and a high-cost manufacturing problem as described earlier. Since the degree of the technical integrity of sapphire substrates is higher than that of SiC substrates, it is important to find a structure of an intermediate layer that is suitable for the use of sapphire substrates and reduces the operating voltage, from the viewpoint of practical use.

Figure 21:
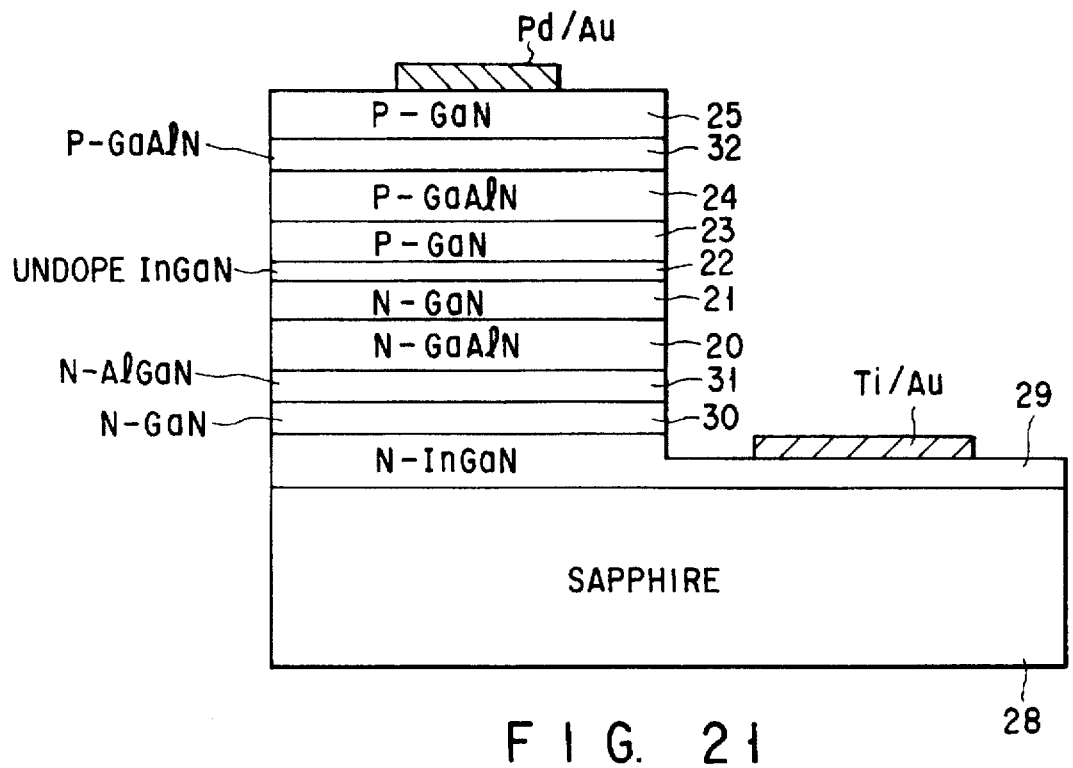
FIG. 21 is a sectional view of a GaN-based laser device on a sapphire substrate in the fifth embodiment.

In FIG. 21, numeral 28 indicates a sapphire substrate and 29 indicates an n-type $In_xGa_{1-x}N$ (x=0.1) buffer layer, which helps improve the crystallinity of a GaN-based multilayer structure grown epitaxially on the sapphire substrate. The buffer layer 29 also serves as the contact layer of a Ti/Au cathode electrode.

Numeral 22 indicates an InGaN active layer, 21, 23 indicate GaN optical guide layers, and 20, 24 indicate $Ga_xAl_{1-x}N$ (x=0.75) cladding layers. Two intermediate layers made of different compounds, that is, an n-type GaN layer 30 and an n-type $Ga_xAl_{1-x}N$ (x=0.9), are formed between the n-type $In_xGa_{1-x}N$ (x=0.1) buffer layer 29 and the $Ga_xAl_{1-x}N$ (x=0.75) cladding layer 20.

Figure 22:
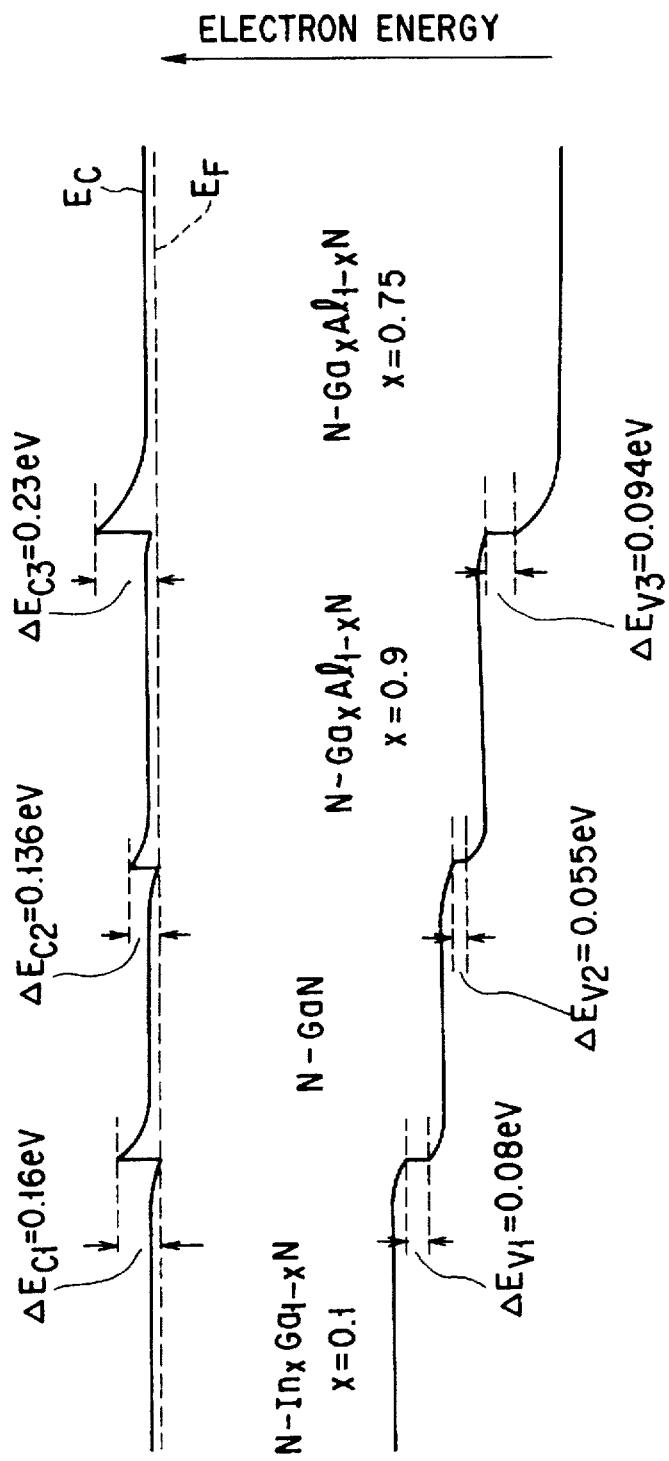
FIG. 22 is a band structure diagram to help explain the effect of using an n-type GaN and n-type GaAlN intermediate layers between n-type InGaN and n-type GaAlN in a fifth embodiment of the present invention.

FIG. 22 shows the effect of the two intermediate layers in reducing the barrier caused in the conduction band. The height of the barrier in the conduction band is 0.23 eV at most, which can be overcome easily by the thermal energy of conducting electrons.

In the sectional view of FIG. 21, a p-type $Ga_xAl_{1-x}N$ (x=0.9) intermediate layer 32 is formed between the p-type $Ga_xAl_{1-x}N$ (x=0.75) cladding layer 24 and a p-type contact layer 25 on the bottom of a Pd/Au anode electrode. The effect of the intermediate layer in reducing the barrier is shown in the state where band offsets take place in the three layers at right of FIG. 22. In this case, too, the barrier in the conduction band is 0.23 eV at most.

As shown in FIG. 21, by placing the n-type intermediate layers 30, 31 and the p-type intermediate layer 32, a GaN-based laser device can be formed on a sapphire substrate whose operating voltage is low. In the configuration of FIG. 21, elimination of the GaN optical guide layers 21, 23 produces a GaN-based light-emitting diode on a sapphire substrate.

Figure 23:
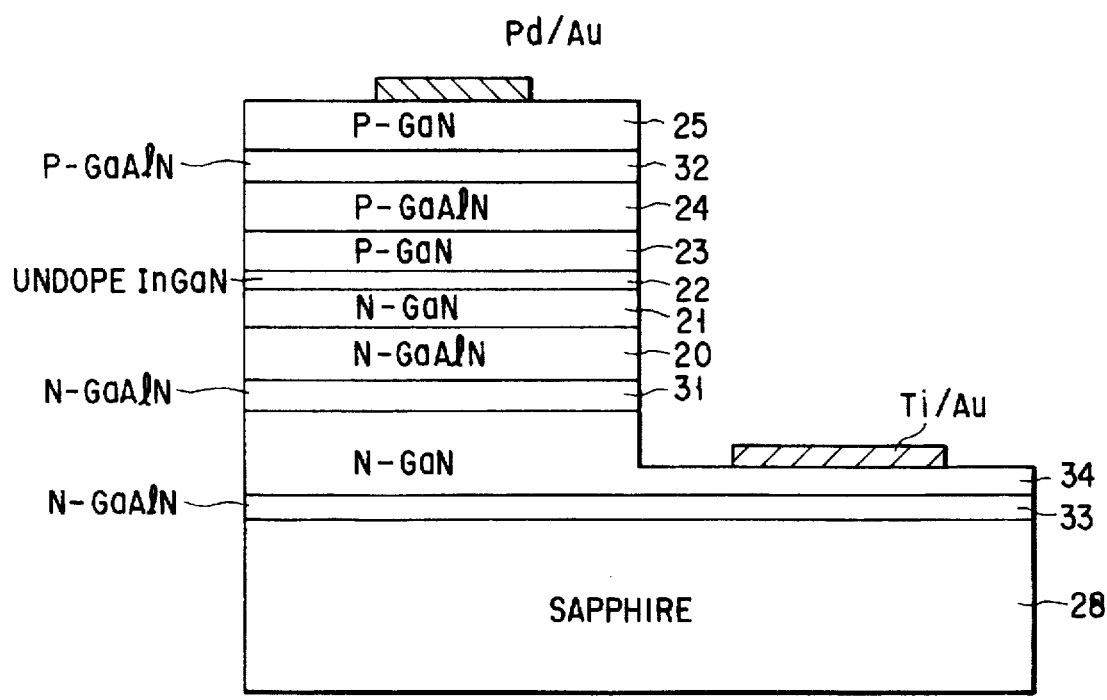
FIG. 23 is a sectional view of a modification of the GaN-based laser device on the sapphire substrate.

FIG. 23 is a sectional view of a modification of the GaN-based laser device on the sapphire substrate with the intermediate layer. In FIG. 23, numeral 33 indicates an n-type $Ga_xAl_{1-x}N$ (x=0.9) buffer layer, on which an n-type GaN layer 34 is provided to serve as the contact layer for a Ti/Au cathode electrode. The n-type $In_xGa_{1-x}N$ (x=0.1) 29 functioning as both a buffer layer and a contact layer on the sapphire substrate in FIG. 21, is shared by the n-type $Ga_xAl_{1-x}N$ buffer layer 33 and n-type GaN contact layer 34. The remaining configuration is the same as that of FIG. 21.

Although a sapphire substrate is used in the fifth embodiment, other single crystalline insulating substrates may also be used as well.

Next, a sixth embodiment of the present invention will be described by reference to FIGS. 24A and 24B.

FIG. 24A is a sectional view of the structure of the active layer 22 in the GaN-based laser device shown FIG. 21 or 23. Ten 5-nm-thick undoped $In_yGa_{1-y}N$ layers and ten 3-nm-thick undoped $In_xGa_{1-x}N$ ($0.1 \leq x-y \leq 0.25$) layers are stacked one on top of another alternately as shown in FIG. 24A, thereby forming an MQW (Multi Quantum Well) structure consisting of 20 layers in total.

FIG. 24B shows a band structure of a section of the MQW (x=0.2, y=0). The depth $\Delta E_c$ of a quantum well in the conduction band is 0.31 eV, the depth $\Delta E_v$ of a quantum well in the valence band is 0.15 eV. Use of an active layer with such an MQW structure makes it possible to produce a GaN-based laser device with wavelength λ=430 nm on a sapphire substrate of a long service life.

Similar laser characteristics can be obtained from an SQW (Single Quantum Well) structure where only a single unit of the undoped $In_xGa_{1-x}N$ (x=0.2) layer is used and n-type and p-type thick GaN optical guide layers are provided on both sides of the undoped layer, one layer on each side.

Finally, a crystallographic problem in growing the intermediate layer will be described. When different types of semiconductors are grown epitaxially on a semiconductor substrate, the conditions for lattice matching are usually considered to be a problem. In a case where a second compound semiconductor (epitaxial layer) is grown via an intermediate layer on a first compound semiconductor (substrate), if the lattice constant of the first compound semiconductor is $a_1$, the lattice constant of the second compound semiconductor is $a_2$, and the lattice constant of the intermediate layer is $a_3$, ideally, $a_1=a_2=a_3$ should hold. If the expression does not hold, it is considered desirable that the lattice constant of the intermediate layer should meet $a_3=a_1$ and $a_3 \neq a_2$ or $a_3 \neq a_1$ and $a_3 = a_2$, or $a_1 < a_3 < a_2$ or $a_1 > a_3 > a_2$.

With the present invention, however, perfect lattice matching does not hold. It was found that when $a_2 \neq a_1$, for example, making the lattice constant $a_3$ of the intermediate layer larger than any of the lattice constant $a_1$, of the substrate and the lattice constant $a_2$ of the epitaxial layer, that is, meeting the expressions $a_3 > a_1$ and $a_3 > a_2$, caused a sort of lattice relaxation via an intermediate layer, enabling epitaxial growth more excellent in crystallinity. Here, to obtain a good result, the thickness of the intermediate layer must be limited. For instance, in a case where a ZnSe layer is grown on a GaAs substrate, setting the thickness t of the $Ga_xAl_{1-x}As$ intermediate layer, near x=0.4, in the range of 100 nm>t >30 nm produces the best result. With the intermediate layer of the present invention, a good result is usually obtained in the range of 100 nm>t>10 nm. In this case, if the thickness of the intermediate layer is 100 nm or more, strain in the intermediate layer will be excessive, permitting point defects or dislocations to occur in the epitaxial growth layer. Therefore, to obtain the best result of the strained intermediate layer, the thickness of the intermediate layer must be limited as described earlier.

In a case where ZnSe, or any other epitaxial layer whose bandgap is large, is grown on a compound semiconductor substrate, if the lattice constant $a_3$ is smaller than any of the lattice constant $a_1$, of the substrate and the lattice constant $a_2$ of epitaxial layer, that is, $a_3<a_1$, and $a_3<a_2$ hold, tensile stress will be applied to the intermediate layer. The tensile stress broadens the bandgap of the intermediate layer. For instance, when a group III-V material whose bandgap is small is used for an intermediate layer in the case of a semiconductor whose bandgap is large like group II-VI, the tensile stress helps improve the ohmic characteristics. A relevant example is a case where $In_xGa_{1-x}As$ is used as an intermediate layer when ZnSe is grown on a GaAs substrate. In this case, with x=0.3, the best result was obtained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A multilayered semiconductor device comprising:

a first n-type compound semiconductor layer containing GaAs;

a second n-type compound semiconductor layer containing ZnSe; and at least one intermediate layer that is composed of an n-type II-VI compound semiconductor layer, including at least an Cd component, wherein the energy value at the conduction band edge that said n-type II-VI compound semiconductor layer has lies between the energy values at the conduction band edges of said first and second n-type compound semiconductor layers adjoining both faces of the intermediate layer.

2. A multilayered semiconductor device according to claim 1, wherein:

said at least one intermediate layer comprises at least one n-type $Al_xGa_{1-x}As$ layer formed on said GaAs side, and at least one n-type $Cd_yZn_{1-y}Se$ layer formed on said ZnSe side, the value of composition x in said at least one n-type $Al_xGa_{1-x}As$ layer is x=0.2, and the value of composition y in said at least one n-type $Cd_yZn_{1-y}Se$ layer is y=0.1.

3. A multilayered semiconductor device according to claim 1, wherein:

said at least one intermediate layer comprises a first intermediate layer consisting of a single n-type $Al_xGa_{1-x}As$ layer formed on said GaAs side, wherein x varies in the direction of thickness, and a second intermediate layer consisting of a single n-type $Cd_yZn_{1-y}Se$ layer formed on said ZnSe side, wherein y varies in the direction of thickness, said first intermediate layer is an n-type $Al_xGa_{1-x}As$ layer in which the value of x increases continuously from the junction surface with said GaAs in the direction of thickness, and said second intermediate layer is an n-type $Cd_yZn_{1-y}Se$ layer in which the value of y decreases continuously from the junction surface with said n-type $Al_xGa_{1-x}As$ layer to the junction surface with the said ZnSe in the direction of thickness.

4. A multilayered semiconductor device according to claim 1, wherein said at least one intermediate layer comprises an n-type $Cd_xZn_{1-x}Se$ layer, wherein $0.05<x<0.3$.

5. A multilayered semiconductor device according to claim 4, wherein said at least one intermediate layer comprises plural n-type $Cd_xZn_{1-x}Se$ layers, wherein $0.05<x<0.3$ in each said $Cd_xZn_{1-x}Se$ layer and each said $Cd_xZn_{1-x}Se$ layer has a respective value of x which is constant in the respective layer.

6. A multilayered semiconductor device comprising:

a first n-type compound semiconductor layer containing GaAs;

a second n-type compound semiconductor layer containing ZnSe; and a plurality of intermediate layers that are composed of n-type $Al_xGa_{1-x}As$ layers formed on the said GaAs side, and a plurality of intermediate layers that are composed of n-type $Cd_yZn_{1-y}Se$ layers formed on the said ZnSe side, wherein, the value of composition x in said n-type $Al_xGa_{1-x}As$ layers is a constant, layer by layer, and is increasing in such a manner that the value of x in one layer is larger than that in the preceding one in the direction from the said GaAs side toward the ZnSe side, and the value of composition y in the said n-type $Cd_yZn_{1-y}Se$ layers is a constant, layer by layer, and is decreasing in such a manner that the value of y in one layer is smaller than that in the preceding one in the direction from the said GaAs side toward the said ZnSe side.

* * * * *